United States Patent [19]

Haken

[11] Patent Number: 4,949,154
[45] Date of Patent: Aug. 14, 1990

[54] THIN DIELECTRICS OVER POLYSILICON

[75] Inventor: Roger A. Haken, Richardson, Tex.

[73] Assignee: Texas Instruments, Incorporated, Dallas, Tex.

[21] Appl. No.: 332,362

[22] Filed: Mar. 30, 1989

Related U.S. Application Data

[60] Continuation of Ser. No. 113,402, Oct. 23, 1987, abandoned, which is a continuation of Ser. No. 846,829, Mar. 31, 1986, abandoned, which is a continuation of Ser. No. 756,637, Jul. 19, 1985, abandoned, which is a division of Ser. No. 468,920, Feb. 23, 1983, Pat. No. 4,577,390.

[51] Int. Cl.$^5$ .................... H01L 29/78; H01L 27/02; H01L 29/34; H01L 29/04
[52] U.S. Cl. ......................... 357/54; 357/23.6; 357/52; 357/59
[58] Field of Search ............ 357/23.5, 23.6, 51, 357/54, 59

[56] References Cited

U.S. PATENT DOCUMENTS

| | | | |
|---|---|---|---|
| 4,115,914 | 9/1978 | Harari | 357/23.5 |
| 4,270,262 | 6/1981 | Hori et al. | 357/59 |
| 4,329,706 | 5/1982 | Crowder et al. | 357/23.9 |
| 4,409,723 | 10/1983 | Harari | 29/571 |
| 4,426,764 | 1/1984 | Kosa et al. | 29/561 |
| 4,451,904 | 5/1984 | Sugiura et al. | 365/182 |
| 4,455,568 | 6/1984 | Shiota | 357/23.6 |
| 4,466,172 | 8/1984 | Batra | 357/54 |
| 4,490,900 | 1/1985 | Chiu | 357/41 |
| 4,495,693 | 1/1985 | Iwahashi et al. | 357/91 |
| 4,577,390 | 3/1986 | Hakens | 357/23.5 |

FOREIGN PATENT DOCUMENTS

| | | | |
|---|---|---|---|
| 53-63879 | 6/1978 | Japan | 357/23.6 |
| 55-22880 | 2/1980 | Japan | 357/23.6 |
| 55-22881 | 2/1980 | Japan | 357/23.6 |

OTHER PUBLICATIONS

E. Suzuki et al., "A Low-Voltage Alterable EEPROM with Metal-Oxide-Nitride-Oxide-Semiconductor (MONOS) Structures", *IEEE Transactions on Electron Devices*, vol. ED-30 (Feb. 1983), pp. 122-128.

T. Ito et al., "Low-Voltage Alterable EAROM Cells with Nitride-Barrier Avalanche-Injection MIS (NAMIN)", *IEEE Transactions on Electron Devices*, vol. ED-26, (Jun. 1979), pp. 906-913.

*Primary Examiner*—J. Carroll
*Attorney, Agent, or Firm*—Douglas A. Sorensen; Rodney M. Anderson; Melvin Sharp

[57] ABSTRACT

The present invention teaches a new method for formation of thin dielectrics over polysilicon. This technique permits the fabrication of poly-to-poly capacitors with high specific capacitance (capacitance per unit area). This technique is completely compatible with standard MOS dual poly regrown gate oxide processes. The high value of specific capacitance is achieved by using a composite dielectric which has high dielectric integrity and whose thickness is completely independent of the formation of the regular gate oxide under the second poly. No extra mask steps are required. The composite dielectric is formed as a grown or deposited oxide followed by a deposited nitride which is then reoxidized. Optionally, a second oxide is deposited before reoxidation performed.

12 Claims, 5 Drawing Sheets

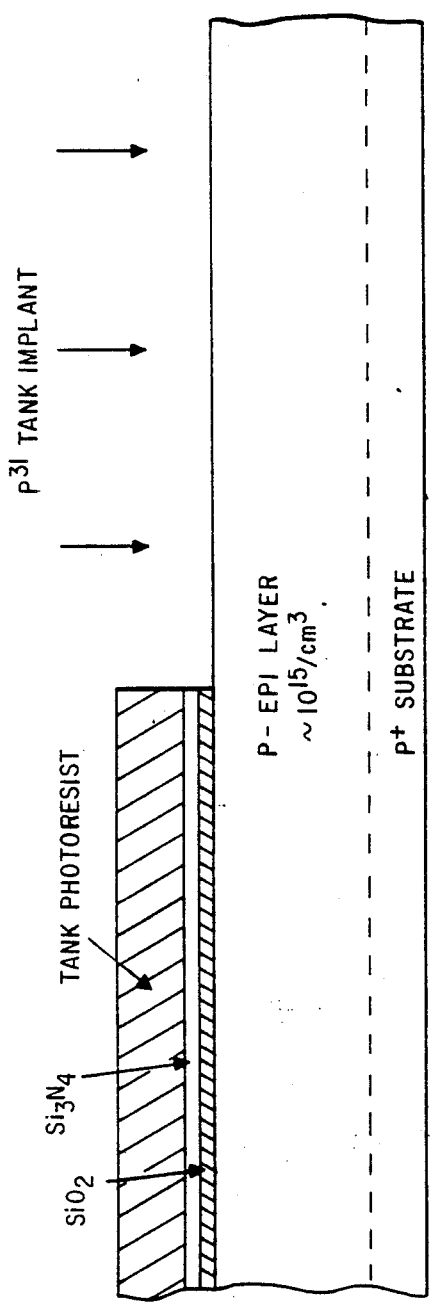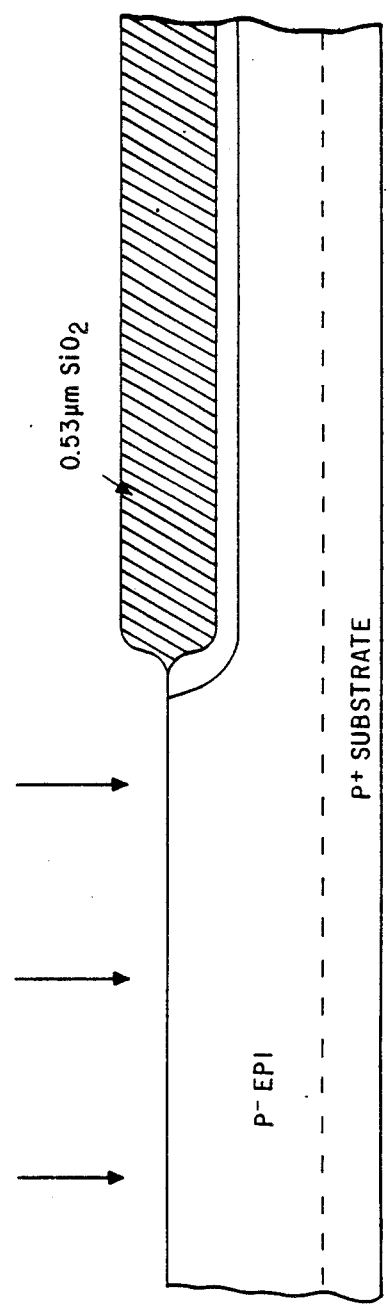

THIN DIELECTRICS OVER POLYSILICON

This application is a continuation of application said Ser. No. 07/113,402 filed Oct. 23, 1987, abandoned, which is a continuation of application Ser. No. 06/846,829, filed Mar. 31, 1986, abandoned, which is a continuation of application Ser. No. 06/756,637, filed July 19, 1985, abandoned, which is a division of application Ser. No. 06/468,920, filed Feb. 23, 1983, U.S. Pat. No. 4,577,390.

BACKGROUND AND SUMMARY OF THE INVENTION

The present invention relates to a method for fabricating a thin capacitor dielectric layer over a layer of polysilicon.

One of the key process issues for realizing high performance analog and digital CMOS circuits is the ability to fabricate precision, high value, poly to poly capacitors, at the same time as low resistance poly gates and interconnect.

A common technique for producing precision poly to poly capacitors is to lightly dope the first level of poly (bottom plate) to 100 ohms /sq, so a very uniform dielectric can be grown at the same time the gate oxide is regrown. Second level poly is then used as the top plate.

Incorporating such a technique into a CMOS flow means that the sheet resistance of uncovered first level poly inside the tank is increased to around 200 ohms per square, due to the counterdoping action of the P+source/drain implant. (This could be avoided by including extra mask steps or merging levels). Outside the tank, the first poly sheet resistance is reduced by the N+source/drain implant to 40 ohms per square. For these reasons many process flows have used 1st poly primarily for the bottom plate of capacitors and low or natural $V_T$ N-channel transistors. 2nd poly, doped to around 15 ohms per square, can be used for regular gates, interconnect and capacitor top plates. High impedance poly resistors in such a process flow would require an extra mask step.

As the process is scaled, this type of flow becomes more important since a polycide layer for low sheet resistance gates and interconnect is required. This follows since the polycide sheet resistance increases with the number of heat treatment cycles and thermal oxidations that follow its deposition.

The main limitation of this technique is that the capacitor's dielectric thickness, and hence maximum value, is controlled by the regrown gate oxide thickness, used for regular gates (2nd poly). For a 700 A gate oxide process this limits the dielectric to about 1100 A (oxide grows faster on doped poly), resulting in a capacitance of 0.2 pF/mil². Scaling the process to 3 microns and the gate oxide to 550 A does significantly increase the maximum capacitance achievable. For some analog integrated circuits the low value of capacitance/unit area means that the area occupied by capacitors is comparable to, or greater than, the rest of the circuitry! Any increase in capacitance will be useful in terms of reduced noise, improved power supply rejection and reduced area. These considerations become more important as the technology is scaled.

The present invention provides a demonstrated technique for fabricating poly to poly capacitors with a much higher capacitance/unit area, 0.8 pF/mil². The technique utilizes a composite oxide/nitride/oxide dielectric whose thickness can be controlled independently of the regrown gate oxide process, without the requirement of an extra mask. The composite dielectric has very good integrity: typical breakdown for a 350 A composite layer is 24-30 V. Leakage measurements indicate characteristics similar to poly capacitors with an 800 A thermally grown oxide. In some of the test experiments the oxide and nitride layers were formed by LPCVD. These have exhibited high uniformity, better than 0.005%/mil or 3% across a 3" slice. A further advantage of using an LPCVD dielectric is that poly 1 can be doped to about 15 ohms per square since it is no longer necessary to thermally grow a uniform oxide. This gives the designer the flexibility of using both heavily doped 1st poly and silicided 2nd poly for interconnect.

A general problem in the development of analog and data conversion integrated circuits is the large area which is frequently required for capacitors. In many applications, it may be found that half of the integrated circuits area is taken up with capacitors. This means that the density of capacitors is the limiting factor in achieving further integration of such analog integrated circuits. If a capacitor could be reliably fabricated within the stream of MOS processing with higher specific capacitance, i.e. higher capacitance per unit area, then smaller capacitors could be used, and capacitors would not be such a burden on the density of analog integrated circuits.

Thus it is an object of the present invention of to provide a method for fabricating capacitors having high specific capacitance for analog and data conversion integrated circuits.

It is a further object of the present invention to provide a method for fabricating capacitors having high specific capacitance in a standard MOS process.

A further important limitation in many analog and telecommunications circuits is that the value of the capacitors must be precise, i.e. the specific capacitance of the as-fabricated capacitors should be constant, from lot to lot, to, e.g., three percent.

Thus it is an object of the present invention to provide a method for reproducibly fabricating capacitors having a desired predetermined specific capacitance.

Capacitors in many analog integrated circuit layouts are preferably fabricated between the first and second poly levels, usually over field oxide, to achieve greater integration. Moreover, it is often greatly preferable to form poly-to-poly capacitors rather than poly-to-silicon substrate capacitors, because a buried N+ or a depletion type implant is required to make contact to the lower plate of the capacitor. Otherwise, the lower plate of the capacitor will in effect be the whole substrate, i.e. one side of the capacitor is grounded. Secondly, if a depletion implant is used, so that the carrier concentration at the lower (substrate) plate of the capacitor is not extremely high, the depletion width will be modulated by the voltage on the capacitor top plate, i.e. the capacitor becomes a nonlinear element in which the capacitance is a variable function of voltage. If a heavy N+ doping is required under poly-to-substrate capacitors, this means that additional processing steps are required. However, forming a precision capacitor over a first poly level is particularly difficult, since the surface of the first poly level will never be as smooth as that of a monocrystalline polished semiconductor surface, that is, the surface of even good poly will normally have a certain amount of unevenness. This unevenness can significantly affect the thickness of an oxide which is formed over the poly. It not only leads to uncertainty in the average specific capacitance, but also can cause formation of areas where an oxide grown over poly is locally thin.

Thus it is a further object of the present invention to provide a method for reliable fabrication of uniform dielectrics over a polysilicon level. The roughness of the polysilicon surface means that pinholing through a dielectric grown over first poly can occur. This problem becomes particularly serious if the dielectric is a thin one, as is required for high specific capacitance. This is a major concern in large analog integrated circuits, since the large total area devoted to capacitors means that even a small density of capacitor pinholes can cause drastic yield degradation.

Thus it is a further object of the present invention to provide a thin poly-to-poly dielectric having a very low density of pinholes.

In double poly processes, a regrown gate oxide is normally used to form transistors having second poly gates. That is, after the first poly level has been completely formed, the areas where transistors and second poly are to be formed are cleared down to silicon, and the gate oxides for second poly transistors are grown from scratch. However, the oxidizing conditions which permit growth of the second gate oxide also promote growth of oxide over the first poly level. Moreover, oxide normally grows faster on doped poly than on crystalline silicon under the same conditions, so that a thicker oxide will be formed over the first poly level. Where the oxide has already been formed over the first poly level before growth of the second gate oxide, as is typical, the oxide thickness over the first poly will be increased by the oxidizing conditions.

The second gate oxide will of course normally be grown to a precisely controlled thickness, but the simultaneous thickness increase of the oxide over the first poly will be uncontrolled. The chief reason for this is because of doping uncertainty. The oxidizing rate is a function of the polysilicon doping level, and the doping level itself cannot be precisely controlled in highly conductive $POCl_3$-doped polysilicon. Even if the polysilicon doping is performed by ion implantation, the average doping level in polysilicon will still be sensitive to the thickness of the polysilicon level deposited, which is also normally not a parameter which can be precisely controlled.

Thus it is an object of the present invention to provide a method for growth of a second gate oxide without any uncontrolled change in the thickness of an existing oxide over a first polysilicon level.

Thus it is an object of the present invention to provide a method for growth of a second gate oxide without simultaneously growing a thick oxide over first poly.

It is a further object of the present invention to provide a method for growing a second gate oxide without increasing the thickness of a dielectric over a first poly level.

A further problem with formation of capacitors is uniformity of the specific capacitance across the wafer. This problem is most acute in data conversion circuits where nonuniformity of capacitors can sacrifice several bits of accuracy. If integrated data conversion circuits are to have performance competitive with custom-trimmed hybrid circuits, uniform specific capacitance is a must. This is also a problem with switched-capacitor filtering, where nonuniformity can substantially degrade filter characteristics.

Thus it is a further object of the present invention to provide a method for forming poly-to-poly capacitors with highly uniform specific capacitance across the wafer.

In the present invention a composite oxide/nitride/oxide dielectric is used over the first poly level, instead of the thermal oxide taught by the prior art. This means that very thin dielectrics can be used over first poly which have very high dielectric integrity (low level of pinholes) and very high dielectric strength (breakdown voltage). Moreover, the dielectrics formed by the present invention are virtually unaffected by the normal second gate oxide growth cycle, so that the problem of uncontrolled thickness increase vanishes.

The problems described above are exacerbated in high voltage circuits, particularly in high voltage telecommunications circuits. Since the oxide thickness must be extremely high in these circuits anyway, to prevent gate/drain breakdown and excessive injection of hot carriers into the gate oxide, the problem of thickening of the oxide over the first poly during the growth of the second poly is exacerbated. That is, a typical thickness for the second gate oxide in a high voltage CMOS process would be 600 angstroms, and while 600 angstroms of oxide are grown on silicon typically 1000 angstroms will be grown on doped poly, or the thickness of an existing oxide layer on poly would be increased.

It is a further object of the present invention to provide a method for fabricating high voltage MOS integrated circuits, in which the thickness of the dielectric between the first and second poly levels can be selected to be equal to or less than the thickness of the second gate oxide.

According to the present invention, there is provided:

An integrated circuit structure comprising:
a substrate;
a first polysilicon layer overlying portions of said substrate;
a dielectric layer on said first polysilicon layer; and
a second polysilicon layer on said dielectric;
wherein said dielectric comprises a silicon dioxide/silicon nitride/silicon dioxide composite.

According to the present invention there is provided:

A method for fabricating a dielectric over a first conductive layer in an integrated circuit fabrication, comprising the steps of:
providing a substrate;
providing a first conductive layer over said substrate, said first conductive layer being polycrystalline and comprising silicon;
forming a silicon dioxide layer over said first conductive layer;
forming a silicon nitride layer over said silicon dioxide layer;
clearing areas of said silicon substrate where a second plurality of transistors are to be formed;
oxidizing said cleared areas of said silicon to form a plurality of second gate oxides, and simultaneously partially oxidizing said nitride layer, whereby a composite oxide/nitride/oxide dielectric is provided over said first conductive layer; and
depositing a second conductive layer selectively over said locations of said second plurality of transistors and over portions of said first conductive layer.

BRIEF DESCRIPTION OF THE DRAWING

The present invention will be described with reference to the accompanying drawings, wherein:

FIGS. 1-9 show a process sequence for forming precision poly-to-poly capacitors according to the present invention in a high voltage CMOS process.

DESCRIPTION OF THE PREFERRED EMBODIMENTS

Figure 3:
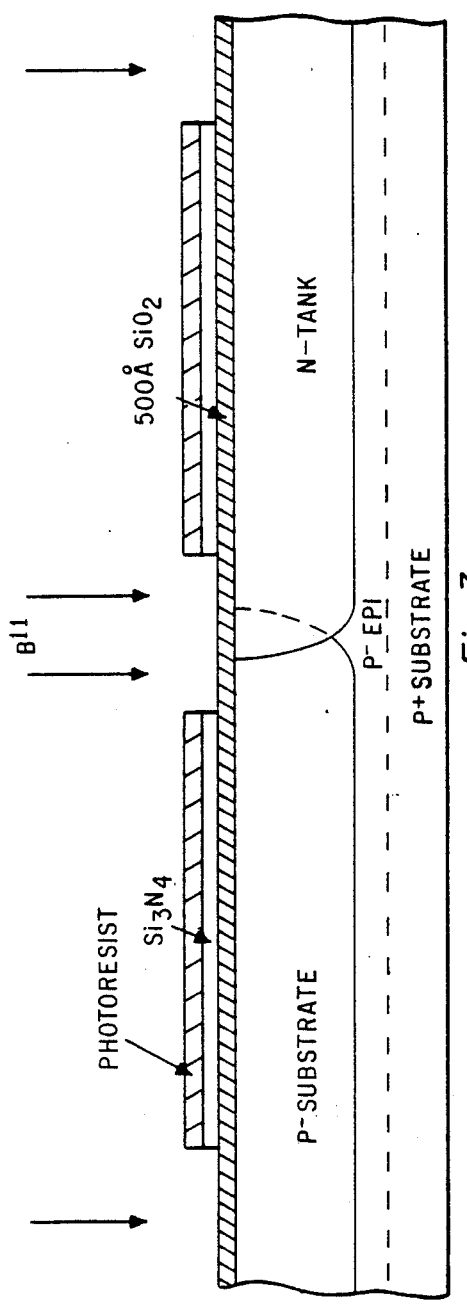
Figure 4:
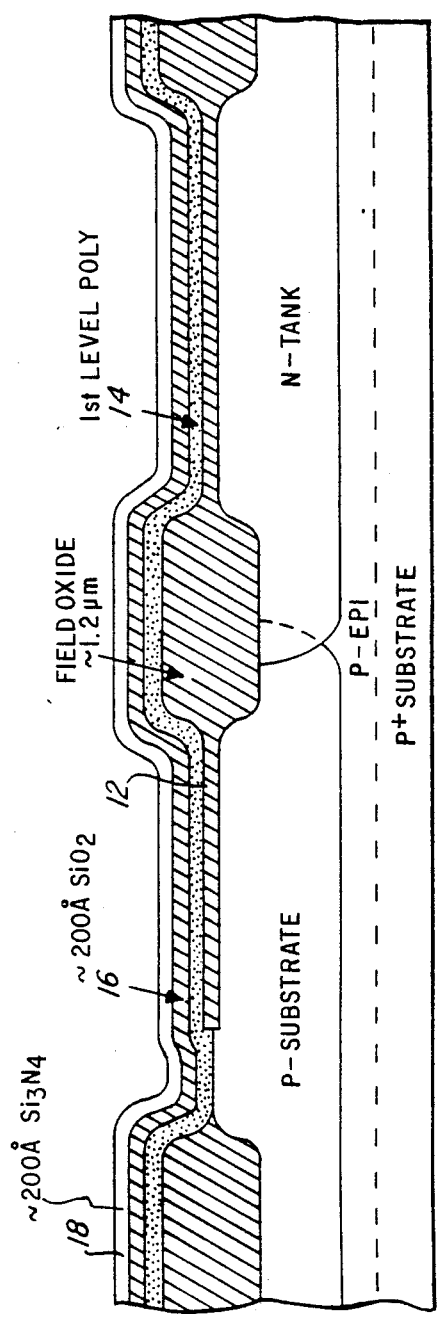
Figure 5:
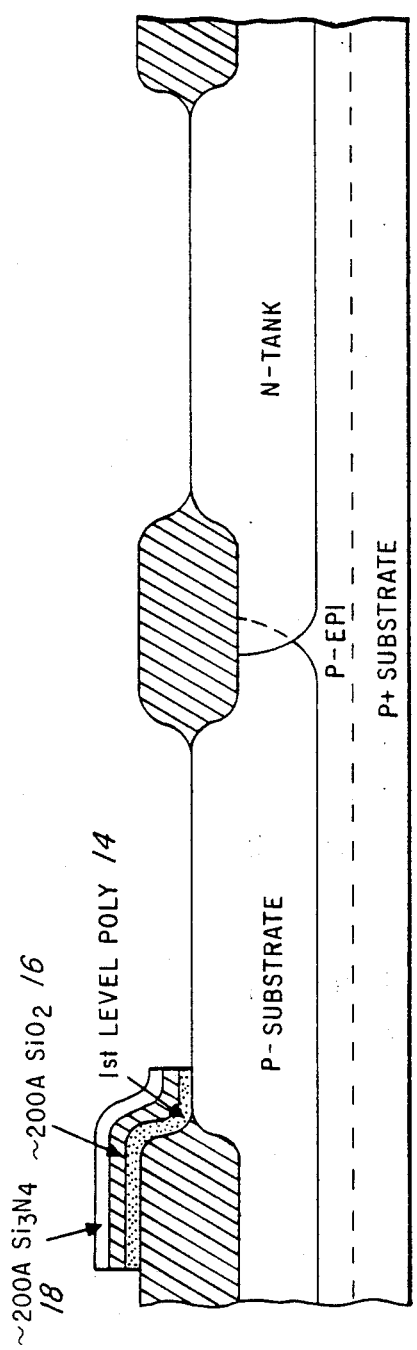
Figure 6:
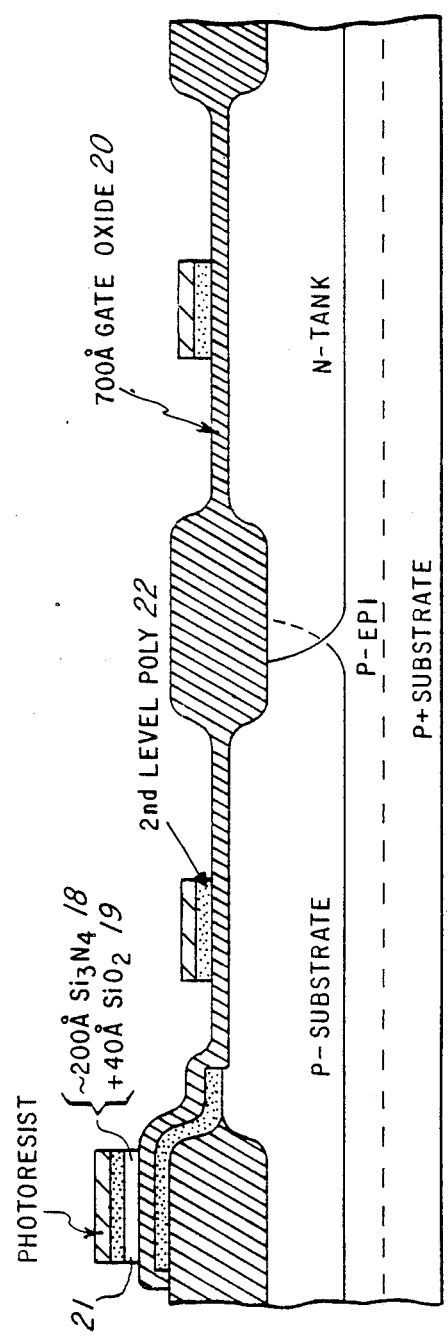

FIGS. 1-9 show how the present invention is applied in the context of a high voltage double poly CMOS process. The key process steps which permit realization of the thin dielectric according to the present invention are as follows:

After the first gate oxide 12 has been grown, the first level 14 of poly is deposited and doped with a phosphorus implant of, e.g., 5E15 per square centimeter.

A thin layer 16 of low pressure CVD silicon dioxide is now deposited (or alternatively thermally grown) to a thickness of 200 angstroms. Next, about 200 angstroms of low pressure CVD silicon nitride 18 is deposited, which leads to the structure shown in FIG. 4.

The prior art has frequently used similarly grown oxides over first polysilicon levels. However, the difficulty in this case is that, if a good thermal oxide is to be grown over a first poly level, the first poly level must have a relatively low doping. That is, the conductivity of the first poly level in this case cannot be made much less than about 100 ohms per square, which means that the first poly level is useless for interconnects. However, if a deposited oxide is used over the first polysilicon level, the first poly level can be highly doped. The chief question would appear to be whether the deposited oxide can be deposited with sufficient uniformity. This has been found to be the case.

As discussed above, it may be preferable to use a deposited rather than a grown first oxide layer for the poly-to-poly dielectric. In one embodiment of the present invention, this is accomplished by a single-reactor multi-dielectric deposition process. The preferred embodiment of this process will now be described in detail.

Preferably a tube reactor is used to deposit low pressure CVD films of nitride and oxide, and optionally also to deposit polysilicon and to perform oxidation. The key feature is that the reactor is kept at the same temperature during all of the various deposition phases applied. *This is critical.* The available precision of furnace control will naturally impose limits on the exact constancy of temperature which can be achieved, but it is preferable that the amount of thermal cycling of the deposition furnace be kept to an absolute minimum. Thermal cycling will tend to release particulates, which is a crucial hazard in any chemical deposition process. In particular, the release of particulates is a particular hazard where nitride is being deposited.

All depositions are LPCVD processes. The preferred oxide deposition is not a standard process, since the process parameters have been adjusted so that the oxide deposition can be performed at the same temperature (800° C. in this embodiment) as the other deposition and oxidizing steps. For oxide deposition, the flow rate used in the presently preferred embodiment is 30 sccm of dichlorosilance and 150 sccm of nitrous oxide, at a total pressure of 500 millitorr. The total pressure can be regulated, for example, by a pump purge of pure nitrogen, which is throttled to keep the tube pressure up to the desired level.

The preferred nitride deposition parameters use the standard Thermco process. That is, 30 sccm of dichlorosiline and 90 sccm of ammonia are flowed at a total pressure of 130 millitorr. Again, the temperature is 800° C.

To perform oxidation, a pure oxygen atmosphere is used, again at the same temperature as the other processing steps in the same reactor (800° C.). At present, due to pump constraints, it is preferred that the oxygen pressure be kept below 150 torr, but this is not a strictly necessary limitation.

Polysilicon can also be grown in the same reactor, without removing the slice from the reactor. The preferred process parameters for polysilicon deposition are 30 sccm of dichlorosilance at a total pressure of 170 millitorr at 800° C. (In the present mode of operation, a nitrogen purge is varied to adjust the total pressure as desired.)

Thus, any of these four process steps can be applied in any sequential combination, without removing the slice from the reactor. This provides major advantages in VLSI processing, of several kinds. First, in any deposition reactor, every load opeation imposes a risk of particulates being dislodged from the carrier or furnace lock. Secondly, every time a slice is exposed to the air, even in a clean room, a substantial risk of particulate matter suffering electrostatic binding to the slice, and particularly to insulating areas on the slice, is incurred. Third, handling damage risks are of course reduced when no handling is used between furnace steps.

As is well known in the art of furnace deposition, it is normally necessary to clean deposited matter off the furnace walls periodically, e.g. by wet etching.

The furnace used is preferably a hot wall furnace, i.e. a tube which is heated by resistance heaters outside of the tube. However, a susceptor-heated furnace or other furnace could alternatively be used. Thus, the present invention can be practiced (although this is not the most preferred embodiment) by, after the first poly level is in place and patterned, applying an oxide layer, applying a nitride layer, applying an oxidizing ambient to partially reoxidize the nitride layer, and then applying a second poly layer. All of these steps could be performed sequentially without removing the slice from the reactor or maneuvering it at all. It is only after the second poly layer has been deposited that the slice must be removed, for doping and etching of the second poly layer.

In an alternative embodiment of the invention, a three layer dielectric stack is applied prior to the reoxidation step. That is, an oxide layer is deposited (or grown), a nitride layer is deposited on the oxide layer, and then another oxide layer is deposited on the nitride layer, prior to the oxidizing step which forms the second gate oxide. Slight additional oxidation of the nitride may take place during the gate oxide regrowth step, but this depends on the thickness of the top oxide. In one embodiment of the invention, a 100 angstrom layer of oxide is deposited, followed by 200 angstrom layer of nitride, followed by 100 angstrom layer of oxide. In this case, significant oxidation of the nitride will typically take place when the second gate oxide is grown (e.g. 20-40 angstroms of the nitride will be oxidized) This embodiment provides even further resistance to dielectric thickness increase and even better integrity, but at the cost of greater process complexity.

The first level 14 of poly and the overlying dielectric 16, 18 are now patterned, to define the bottom plate of capacitors. (The gate oxides for transistors with second poly gates will be formed later). The first gate oxide 12 under the first poly level 14 is also etched, at this time, together with the first poly 14. This results in the structure shown in FIG. 5.

The second gate oxide 20 is then grown to a thickness of, e.g., 600 angstroms, which at the same time partially oxidizes the 200 angstrom silicon nitride layer 18. However, the nitride oxidation is a self-limiting process, and only about 40 angstroms of oxide 19 forms on top of the nitride layer 18. This tends to plug up any pinholes in the thin nitride layer 18.

It is important to note that the second gate oxidation conditions are relatively unimportant to the dielectric stack. That is, the dielectric stack thickness and the second gate oxide thickness are completely independent parameters and can therefore be separately controlled (in processing) and separately optimized (in design).

The layer of oxide 19 is not only quite thin, but is also not truly separated from the nitride layer 18. That is, a region of graded oxide/nitride composition will exist instead of a sharp boundary, and for this reason the oxide layer 19 is not shown separately in FIGS. 6-9. That is, it is more correct to refer to a composite layer 21 than to separate layers 19 and 18.

This is a major source of the advantage of the present invention, in that, not only are the nitride pinholes out of alignment with the underlying oxide pinholes, but also the nitride pinholes themselves tend to be plugged by the reoxidation step.

After performing any transistor threshold adjustments, the second level poly 22 is deposited and doped with phosphorous oxychloride. The second poly 22 is then patterned and etched. Any exposed nitride 18 is also etched at this step, and this results in the structure of FIG. 6.

Figure 7:
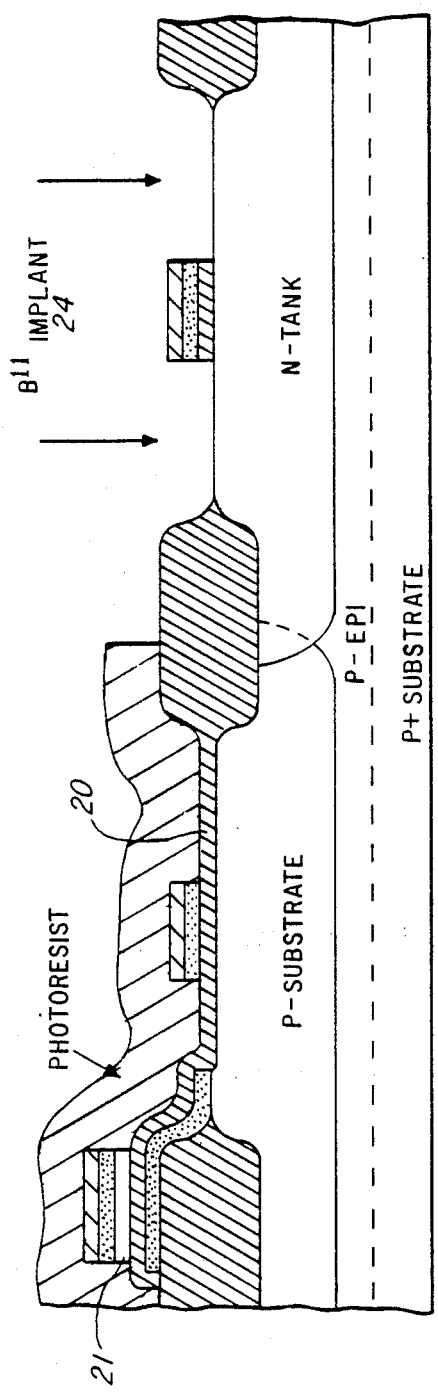

The P+ source/drain implants 24 are then performed, as shown in FIG. 7.

Figure 8:
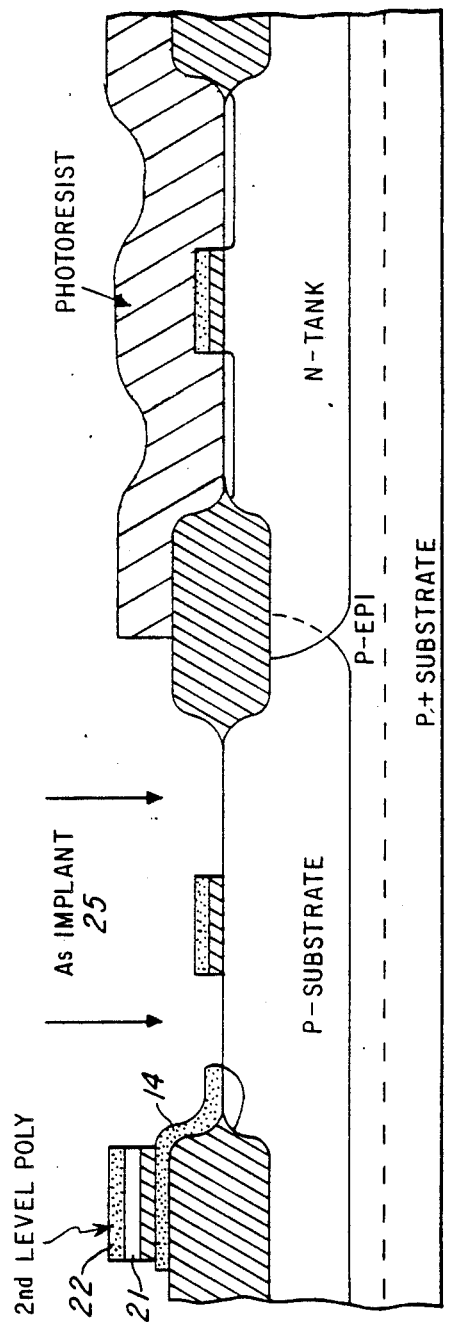
Figure 9:
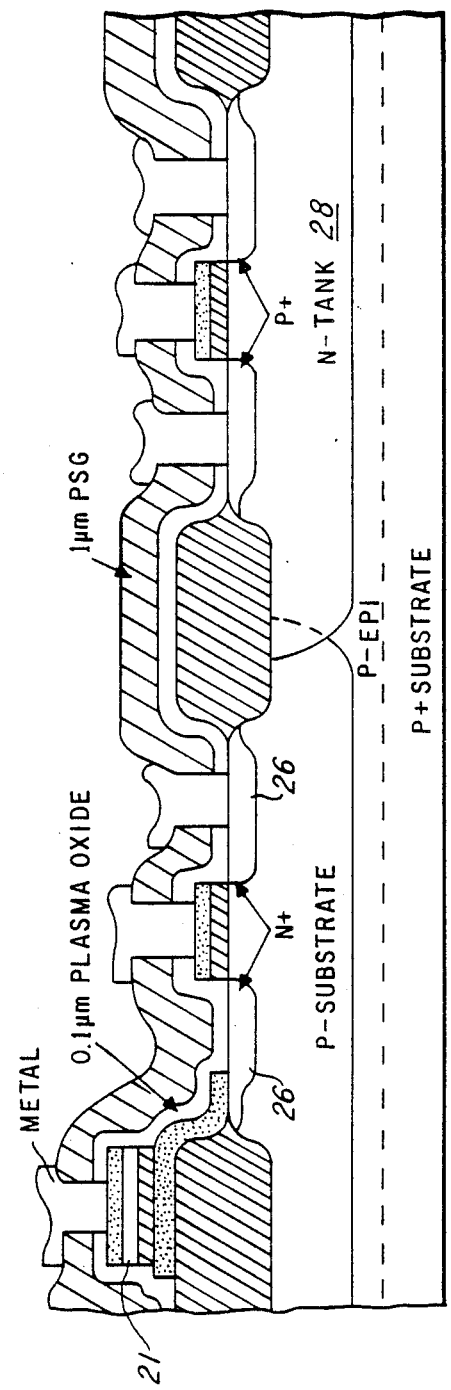

Next the N+ source/drain regions 26 are patterned and the exposed gate oxide 20 is stripped. This removes oxide from on top of the second poly, the exposed first poly, and exposed portions of the silicon substrate. This is shown in FIG. 8. Note that the heavy N+ source/drain implant 25 dopes up the exposed first level poly 14 outside of the n-tank region, so that first level poly 14 can also be used for interconnect and for such other uses as N-channel depletion transistors or natural $V_t$ transistors.

Because silicon nitride has a higher dielectric constant than silicon dioxide (approximately 7 vs. 4), a layer of silicon nitride is electrically equivalent to a thinner layer of silicon dioxide. For example, in the presently preferred embodiment, a 200 angstrom layer of silicon nitride has the same approximate electrical thickness as 120 angstroms of silicon dioxide, so that the total equivalent thickness of the dielectric layer formed is equivalent to about 350 angstroms of silicon dioxide. This permits the formation of poly capacitors with a specific capacitance in the neighborhood of 0.8 picofarads per square mil.

It should be noted that the uniformity of specific capacitance across the wafer is strongly dependent on the uniformity of the silicon nitride layer. However, low pressure chemical vapor deposition has been found to give excellent uniformity for nitride layers as thin as 100 angstroms.

As noted above, the present invention is not by any means limited to application in high voltage processes, but is also useful for analog integrated circuits operating at lower voltages, for conventional DRAM cells, and for any other application whatsoever where formation of a poly-to-poly capacitor is necessary. That is, according to the present invention, after a first polysilicon layer has been provided: a thin oxide layer is grown or deposited over the first poly; a thin nitride layer is also formed over the first poly; and the grown nitride layer is partially reoxidized. Preferably the nitride is partially reoxidized simultaneously with the formation of a second gate oxide. Optionally an upper oxide is deposited over the nitride before the reoxidation step. This sequence of steps can be inserted in a very wide variety of integrated circuit processes, including not only MOS but also bipolar integrated circuit processes.

Moreover, it should be noted that, although formation of capacitors between two polysilicon levels has been primarily referred to, this is not strictly necessary. For example, the dielectric according to the present invention can easily be formed between a first polysilicon layer and a polycide (i.e. polysilicon/silicide composite), pure silicide, or metal top layer.

Moreover, it is also possible to form a thin uniform capacitor dielectric according to the present invention over a polycide or pure silicide first layer, although this is not the preferred embodiment of the invention. In this case, the oxide and nitride dielectric layers would both preferably be deposited. With silicide or polycide, as with polysilicon, the surface of the silicide layer will normally be uneven. Thus, the same difficulties caused by physical excursion exists with silicide or polycide as exists with polysilicon. Moreover, in silicide and polycide as in polysilicon, a significant fraction of dopant impurities will normally be included in the material, and these impurities which are uncontrolled will also affect the oxidation rate of the first plate material in an uncontrolled manner. Most silicides are susceptible to partial oxidation (nuisance oxidation) during the oxidizing condition which are used to form the second gate oxide, and therefore the present invention is useful to avoid growth of an uncontrolled thickness of silicon and metal oxides over a silicide bottom layer.

The present invention advantageously provides a method for fabricating capacitors having high specific capacitance for analog and data conversion integrated cirucits.

The present invention advantageously provides a method for fabricating capacitors having high specific capacitance in a standard MOS process.

The present invention advantageously provides a method for reproducibly fabricating capacitors having a desired predetermined specific capacitance.

The present invention advantageously provides a method for reliable fabrication of uniform dielectrics over a uniform polysilicon level.

The present invention advantageously provides a thin poly-to-poly dielectric having a very low density of pinholes.

The present invention advantageously provides a method for growth of a second gate oxide without simultaneously growing a thick oxide over first poly.

The present invention advantageously provides a method for growing a second gate oxide without increasing the thickness of a dielectric over a first poly leve.

The present invention advantageously provides a method for forming poly-to-poly capacitors with highly uniform specific capacitance across the wafer.

The present invention advantageously provides a method for fabricating high voltage MOS integrated circuits, in which the thickness of the dielectric between the first and second poly levels can be selected to be equal to or less than the thickness of the second gate oxide.

As will be obvious to those skilled in the art, the present invention provides a process innovation having very wide applicability, and can be practiced in the context of a very wide variety of integrated circuit processes, and with a very wide variety of modifications and variations. The scope of the claimed invention is therefore not limited except as specified in the accompanying claims.

What is claimed is:

1. An integrated semiconductor device comprising:
   a substrate having a stack area and a transistor area;
   an insulating layer formed on said substrate over said stack area;
   a first conductive layer formed on said insulating layer;
   a first silicon dioxide layer formed on said first conductive layer;
   a silicon nitride layer formed on said first silicon dioxide layer;
   a second silicon dioxide layer, said second silicon dioxide layer being formed by thermal oxidation of said silicon nitride layer, of the exposed portions of said first conductive layer and of the exposed portions of said substrate; and
   a second conductive layer formed on said second silicon dioxide layer, said second conductive layer formed over said stack area and said transistor area.

2. An integrated circuit device as in claim 1, wherein said substrate is a crystalline silicon substrate.

3. An integrated circuit device as in claim 1, wherein said insulator layer comprises silicon dioxide.

4. An integrated circuit device as in claim 1, further comprising a first doped region formed on said substrate, horizontally adjacent to said second conductive layer; and
   a second doped region formed on said substrate, horizontally adjacent to said second conductive layer and formed opposite said second conductive layer from said first doped region.

5. An integrated circuit device as in claim 1, wherein said second silicon dioxide layer is thinner over said stacked region than over said transistor region.

6. An integrated circuit device as in claim 1, wherein said first conductive layer comprises doped polycrystalline silicon having a resistivity of less than 100 ohms per square.

7. An integrated semiconductor device comprising:
   a substrate having a stack area and a transistor area;
   an insulating layer formed on said substrate over said stack area;
   a first polycrystalline silicon layer formed on said insulating layer;
   a first silicon dioxide layer formed on said first polycrystalline silicon layer;
   a silicon nitride layer formed on said first silicon dioxide layer;
   a second silicon dioxide layer, said second silicon dioxide layer being formed by thermal oxidation of said silicon nitride layer, of the exposed portions of said first conductive layer and of the exposed portions of said substrate; and
   a second polycrystalline silicon layer formed on said second silicon dioxide layer, said second polycrystalline silicon layer formed over said stack area and said transistor area.

8. An integrated circuit device as in claim 7, wherein said substrate is a crystalline silicon substrate.

9. An integrated circuit device as in claim 7, wherein said insulator layer comprises silicon dioxide.

10. An integrated circuit device as in claim 7, further comprising a first doped region formed on said substrate, horizontally adjacent to said second polycrystalline silicon layer; and
    a second doped region formed on said substrate, horizontally adjacent to said second polycrystalline silicon layer and formed opposite said second polycrystalline layer from said first doped region.

11. An integrated circuit device as in claim 7, wherein second silicon dioxide layer is thinner over said stacked region than over said transistor region.

12. An integrated circuit device as in claim 7, wherein said first polycrystalline silicon layer comprises doped polycrystalline silicon having a resistivity of less than 100 ohms per square.

* * * * *